United States Patent [19]
Lim

[11] Patent Number: 5,879,989
[45] Date of Patent: Mar. 9, 1999

[54] METHOD FOR FABRICATING NONVOLATILE MEMORY DEVICE USING DISPOSABLE LAYER

[75] Inventor: Min-Gyu Lim, Chungcheongbuk-do, Rep. of Korea

[73] Assignee: LG Semicon Co., Ltd., Chungcheongbuk-do, Rep. of Korea

[21] Appl. No.: 779,147

[22] Filed: Jan. 3, 1997

[30] Foreign Application Priority Data

Jan. 3, 1996 [KR] Rep. of Korea ............................. 96-I3

[51] Int. Cl.$^6$ ............................................. H01L 21/8247
[52] U.S. Cl. ......................................................... 438/257
[58] Field of Search ..................... 438/257–267

[56] References Cited

U.S. PATENT DOCUMENTS

| | | |
|---|---|---|
| 5,143,860 | 9/1992 | Mitchell et al. . |
| 5,378,643 | 1/1995 | Ajika et al. ............................. 438/257 |
| 5,395,779 | 3/1995 | Hong . |
| 5,418,741 | 5/1995 | Gill ........................................ 365/182 |
| 5,658,814 | 8/1997 | Lee ........................................ 438/588 |

*Primary Examiner*—Richard A. Booth

[57] ABSTRACT

A nonvolatile memory device includes: a substrate having field and active regions; a field insulating layer formed on the field region; a first gate insulating layer formed on the active region; a floating gate formed on the first gate insulating layer and on a portion of the field insulating layer, the portion extending from the first gate insulating layer, the floating gate being separated from the field insulating layer; a second gate insulating layer formed on the surface of the floating gate; a control gate formed on the second gate insulating layer; and an impurity region formed in a portion of the substrate, the portion being placed on both sides of the control gate.

20 Claims, 5 Drawing Sheets

METHOD FOR FABRICATING NONVOLATILE MEMORY DEVICE USING DISPOSABLE LAYER

BACKGROUND OF THE INVENTION

The present invention relates to a nonvolatile memory device and method for fabricating the same, and more particularly to a nonvolatile memory device (and method for fabricating the same) having an increased coupling ratio of a floating gate and control gate, and thereby an improved programming characteristic of the memory device.

As shown in FIG. 1, a conventional flash memory cell is formed in a manner that an active region (A) is defined between field insulating layers 21, a control gate electrode line 25 is formed perpendicular to the field insulating layer 21, and a floating gate 23 is formed on a portion where the active region (A) and the control gate meet. The floating gate 23 is isolated from the active region and the control gate.

A method for fabricating the conventional flash memory cell will be explained below. Field insulating layer 21 is formed on a substrate 20, and a gate oxide layer 22 is formed on the substrate. Polysilicon is deposited on the exposed surfaces, and patterned in a first direction to form floating gate 23. An interlevel insulating layer 24 is formed on the exposed surfaces, and polysilicon is deposited thereon and patterned in a second direction, perpendicular to the first direction, to form control gate 25. Here, floating gate 23 is formed by etching the first-direction-patterned polysilicon layer using control gate 25 as a self-aligning mask, to form a final floating gate 23. Then, ions are implanted into an exposed portion of the substrate, to form a source and drain on both sides of the gate. The above-mentioned flash memory cell is programmed by injecting electrons into floating gate 23, or not, to change the threshold voltage of its channel.

The programming of the memory cell is performed by applying a voltage to the control gate and drain electrode (not shown). This voltage is relatively higher than that applied to the source electrode (not shown). Here, the voltage applied to the control gate is induced to the floating gate according to the coupling effect, and the induced voltage draws hot electrons generated nearby the drain. The coupling induced voltage induced to the floating gate is proportional to the contact area of the control gate and floating gate. That is, the higher a coupling ratio kc is, the larger the induced voltage is. If coupling ratio kc is large, the programming efficiency and characteristic are improved. Coupling ratio kc is determined by a capacitance Cpp between the control gate and floating gate, and a capacitance Cox between the floating gate and silicon substrate. Coupling ratio kc of a stacked gate flash memory cell is Cpp/(Cpp+Cox). Accordingly, the coupling ratio kc becomes higher as capacitance Cpp becomes larger than capacitance Cox. For the purpose of increasing capacitance Cpp, the interlevel insulating layer's dielectric constant must be made larger, or its thickness thinner. Otherwise, the superposed area of the floating gate and control gate must be increased.

However, a conventional method for increasing the superposed area of the floating gate and the control gate causes an increase of the memory cell area. In order to make the superposed area of the floating gate and control gate relatively larger than the superposed area of the floating gate and silicon substrate, the floating gate should cover a larger portion of the field insulating layer 21, as shown in FIG. 1. This increases the width of the floating gate. As a result, the memory cell size is increased.

To apply a voltage which is easily programmed to the floating gate without enlarging the area of a portion of the floating gate, which portion is formed on the field insulating layer, the voltage applied to the control gate should be increased. The greater the voltage applied to the floating gate, the shorter the time required for electron injection into the floating gate to reach saturation. This increases the programming speed of the memory cell.

SUMMARY OF THE INVENTION

It is an object of the present invention to provide a nonvolatile memory device and method for fabricating the same in which the superposed area of its floating gate and control gate is enlarged to increase its coupling ratio, thereby improving the programming characteristic of the device.

To accomplish the object of the present invention, there is provided a method for fabricating a nonvolatile memory device, including the steps of: defining field and active regions on a substrate; forming a field insulating layer on the field region, and forming a disposable layer on the field insulating layer; forming a first gate insulating layer on the active region; forming a floating gate on the first gate insulating layer and on a portion of the disposable layer, the portion extending beyond the active region; removing the disposable layer; forming a second gate insulating layer on the surface of the floating gate; forming a control gate on the second gate insulating layer; and forming an impurity region in a portion of the substrate, the portion being placed on at least one side sides of the control gate.

It is preferable that a sidewall is formed on the side of the field insulating layer and disposable layer before the formation of the floating gate. The disposable layer is removed through an isotropic etching, for example, wet etching.

For the object of the present invention, there is further provided a nonvolatile memory device including: a substrate having field and active regions; a field insulating layer formed on the field region; a first gate insulating layer formed on the active region; a floating gate formed on the first gate insulating layer and on a portion of the field insulating layer, the portion extending from the first gate insulating layer, the floating gate being, separated from the field insulating layer; a second gate insulating layer formed on the surface of the floating gate; a control gate formed on the second gate insulating layer; and an impurity region formed in a portion of the substrate, the portion being placed on at least one side of the control gate.

The nonvolatile memory device preferably includes a sidewall formed of an insulating material on the side of the field insulating layer, and this sidewall is higher than the field insulating layer.

BRIEF DESCRIPTION OF THE DRAWINGS

The novel features believed characteristic of the invention, as well as other features and advantages thereof, will best be understood by reference to the following detailed description of a particular embodiment, read in conjunction with the accompanying drawings, wherein.

DETAILED DESCRIPTION OF PREFERRED EMBODIMENT

Figure 1:
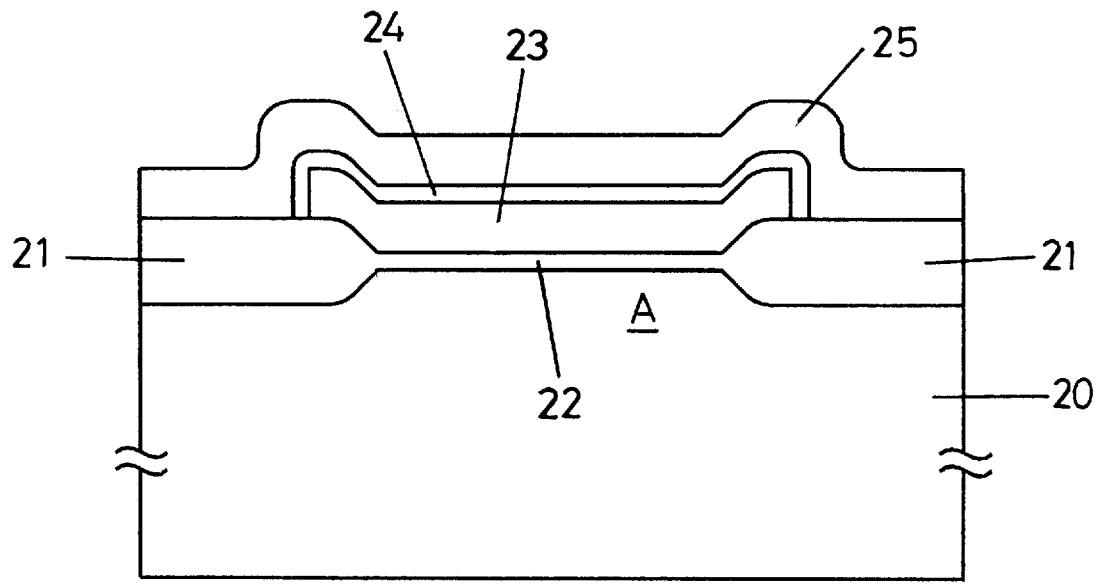
FIG. 1 is a cross-sectional view showing a conventional method for fabricating a nonvolatile memory device.
Figure 2:
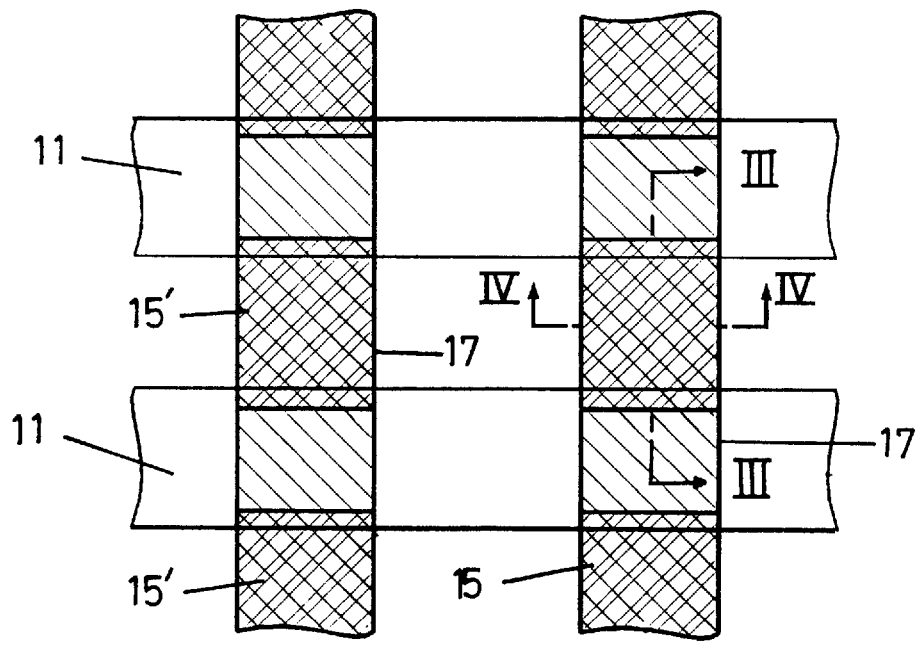
FIG. 2 is a layout of a nonvolatile memory device according to the present invention.

A preferred embodiment of the present invention will be explained below with reference to the accompanying drawings. FIG. 2 is a layout of a nonvolatile memory device according to the present invention, FIGS. 3A to 3D are cross-sectional views showing a method for fabricating a nonvolatile memory device according to the present invention, taken along line III—III of FIG. 2, and FIGS. 4A and 4B are cross-sectional views showing a method for fabricating a nonvolatile memory device according to the present invention, taken along line IV—IV of FIG. 2.

Figure 3A:
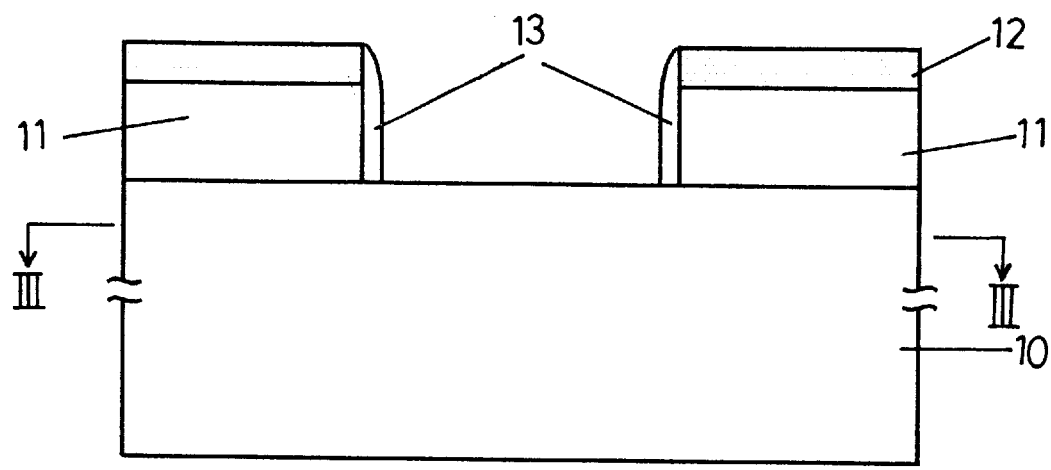
FIGS. 3A to 3D are cross-sectional views showing a method for fabricating a nonvolatile memory device according to the present invention, taken along line III—III of FIG. 2.
Figure 4A:
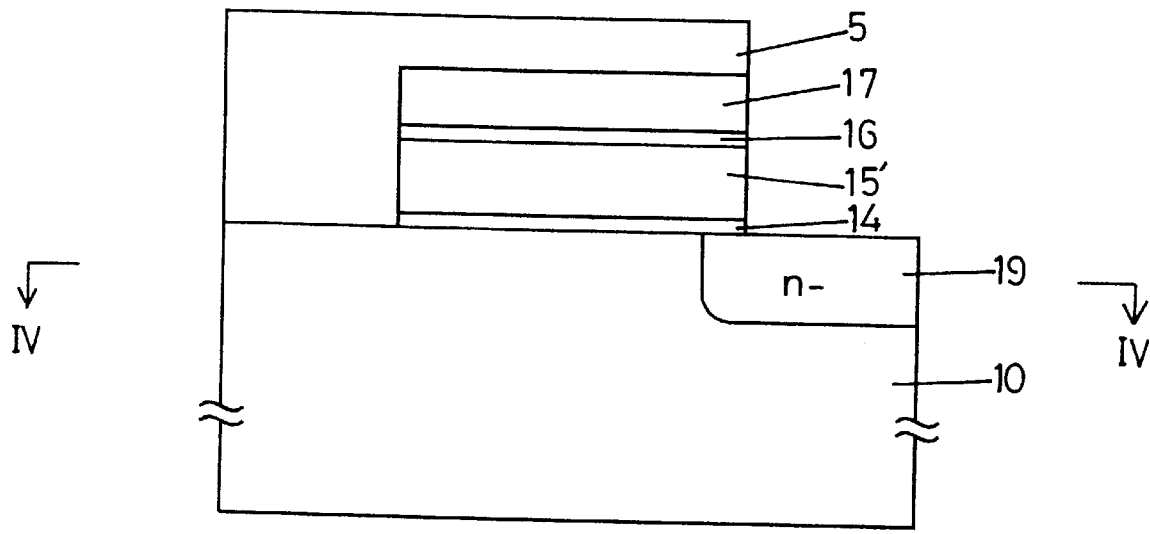
FIGS. 4A and 4B are cross-sectional views showing a method for fabricating a nonvolatile memory device according to the present invention, taken along line IV—IV of FIG. 2.
Figure 4B:
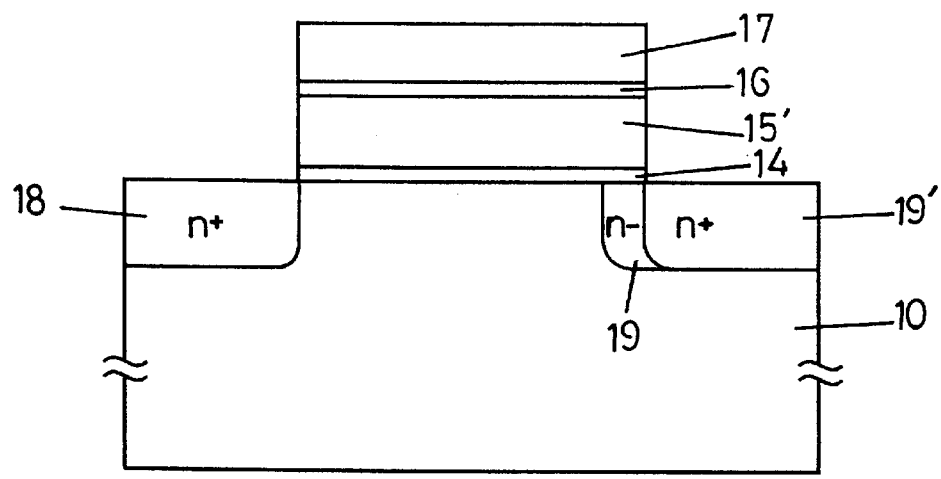

As shown in FIG. 3A, a field insulating layer such as oxide layer 11 is formed on a semiconductor substrate 10, and a disposable layer such as nitride layer 12 is formed thereon. Oxide layer 11 and nitride layer 12 are selectively etched through photolithography, to define active and field regions. A portion in which the oxide layer and nitride layer are etched becomes the active region. The active region is formed in the form of a strip in order to arrange ROM (or other memory) cells in an array. The field region is also formed in the form of a strip. By doing so, the active and field regions are alternately arranged. Thereafter, an insulating layer such as an oxide layer is formed on the substrate, and etched back to form an oxide layer spacer, that is, a sidewall 13, on the side of the oxide layer 11 and the nitride layer 12.

Figure 3B:
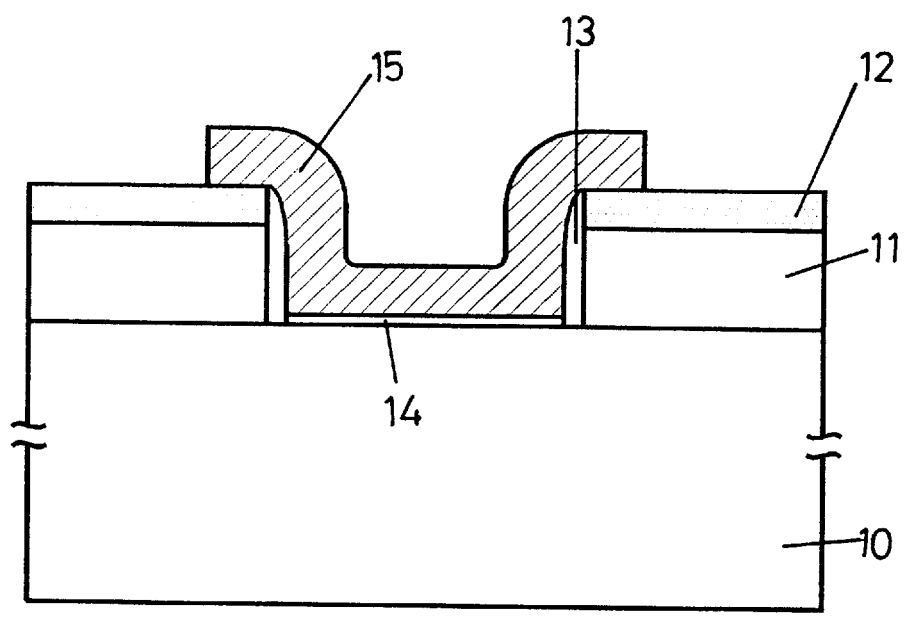
Figure 5:
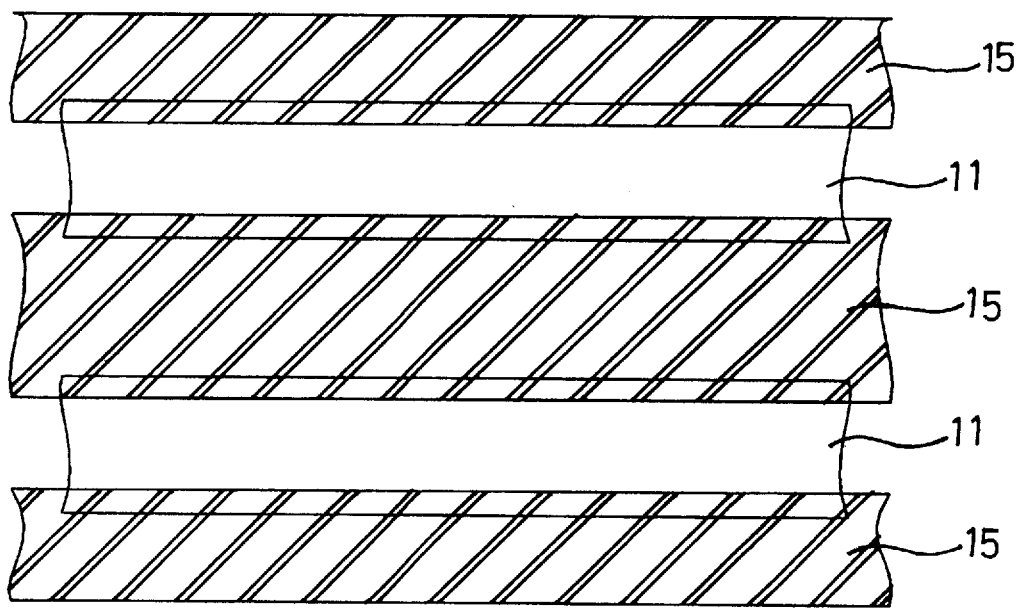
FIG. 5 is a plan view showing a floating gate before its finished form, in accordance with the present invention.

As shown in FIG. 3B, a gate insulating layer such as an oxide layer 14 is formed on a channel region of the active region, and polysilicon is deposited thereon. The polysilicon layer is patterned through photolithography, to form a floating gate 15 as shown in FIG. 5. The floating gate 15 is formed on the active region, and it is also formed to cover a portion of the disposable layer 12 placed on the side portion of the field region adjacent to the active region. The floating gate is formed parallel to the active region.

Figure 3C:
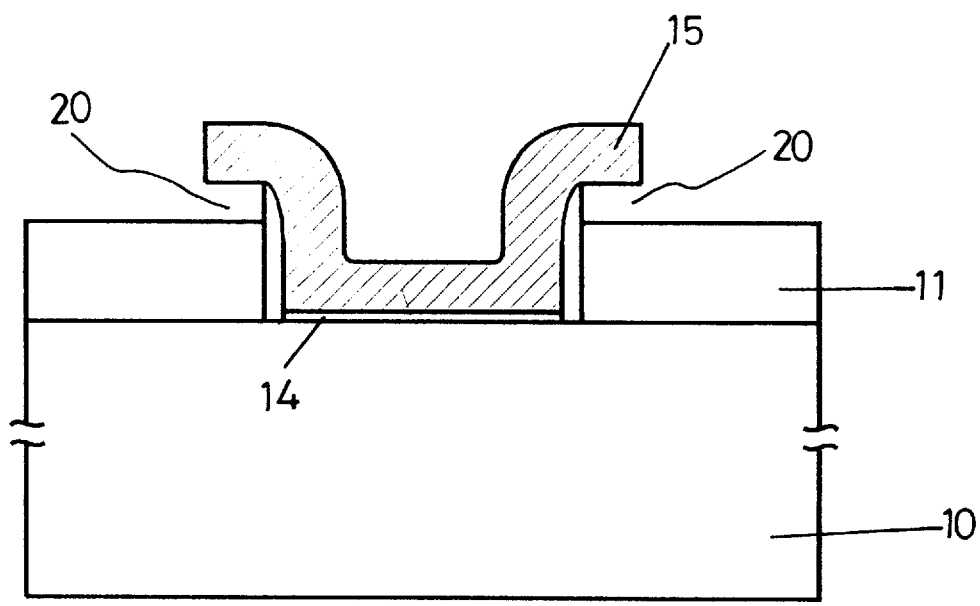
Figure 3D:
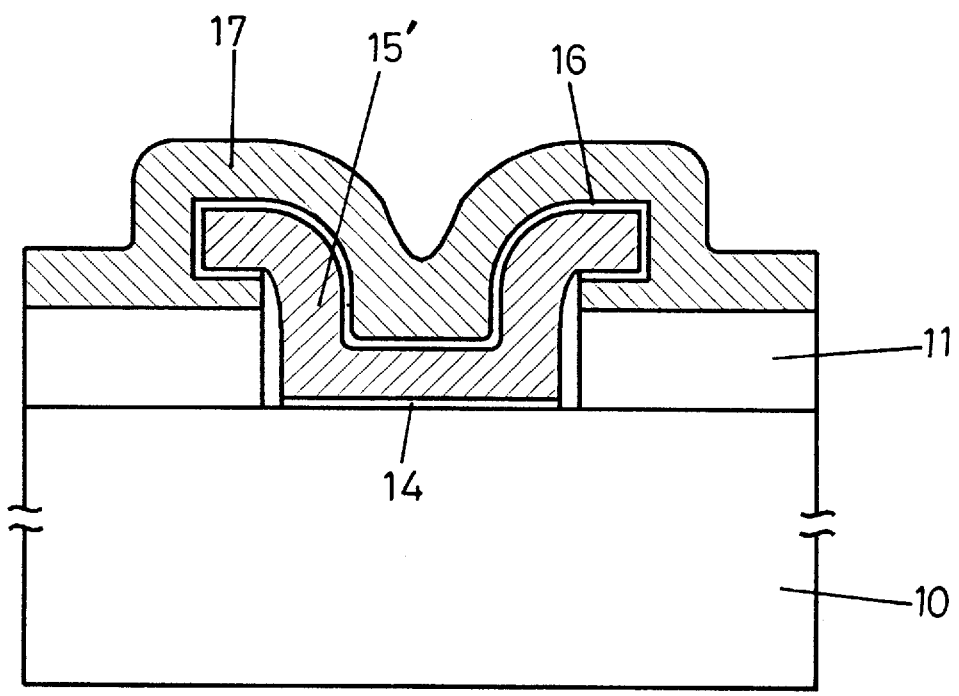

As shown in FIG. 3C, disposable (nitride) layer 12 is removed, preferably by isotropic etching, such as wet etching. By doing so, the nitride layer placed under the floating gate 15 is also removed to form a space 20 between field insulating layer 11 and floating gate 15 at each end of the floating gate 15. Then, as shown in FIG. 3D, an interlevel (gate) insulating layer 16 is formed on the surface of floating gate 15, which is for the purpose of isolating the floating gate from a control gate which will be formed in the following step. Then, polysilicon is deposited on the interlevel insulating layer 16, and patterned to form a control gate 17.

In the event that a two-dimensional cell array is to be formed, then the active region is formed horizontally and the control gate is formed vertically (here, horizontal and vertical directions merely refer to two different directions which together form the dimensions of the array). The floating gate formed parallel to the active region, that is, horizontally, is cut vertically to be left only under the control gate, thereby forming a final floating gate 15' (FIG. 3D) by a unit cell. Thereafter, ions are implanted into an exposed portion of the active region placed on both sides of the floating gate 15' and the control gate 17 horizontally, to thereby form an impurity region. The impurity region is formed on both sides of the channel, and serves as a source and drain.

A method for forming the impurity region will be explained below. As shown in FIG. 4A, a photoresist mask 5 is formed to cover the control gate 17 and to cover one side of floating gate 15' and control gate 17, and ions are implanted into the other side of the floating gate and the control gate in a low concentration. Then, the implanted ions are diffused to form an n- impurity region 19.

As shown in FIG. 4B, the photoresist mask 5 is removed. Then, both sides of the floating gate 15' and the control gate 17 in a horizontal direction are exposed, and ions are heavily implanted thereinto to form an n+ impurity region 18 and 19'. By doing so, an impurity region having a lightly doped drain (LDD) structure is formed in the drain region.

The nonvolatile memory device formed by the aforementioned method is constructed in such a manner that the active and field regions are defined on the semiconductor substrate, source and drain electrodes are formed on both sides of the channel region placed in the active region, and the gate insulating layer 14 is formed on the channel region.

Sidewall spacer 13 is formed on the side of the field insulating layer 11 formed on the field region. The sidewall spacer 13 is formed of a insulator, and has a height higher than the field insulating layer 11. Floating gate 15', which is formed on the gate insulating layer 14 and the sidewall spacer 13, is separated from the side of the field insulating layer 11 by a space in which the disposable layer 12 had been formed.

Control gate 17 is formed on the interlevel insulating layer 16 which isolates the floating gate 15' from the control gate 17. The control gate 17 surrounds the floating gate 15' from the edge of the field insulating layer 11. That is, the cross-section of the gate electrode line in length is as shown in FIG. 3D, and the cross-section perpendicular to the length direction of the gate electrode line is as shown in FIGS. 4A and 4B. Here, e.g., the sidewall spacer 13 is formed of a silicon oxide layer, and the control gate 17 and the floating gate 15' are formed of polysilicon.

According to the present invention, without increasing the cell size, it is possible to enlarge the contact area of the floating gate and the control gate, improving the coupling effect. Accordingly, the programming characteristic of the nonvolatile memory of the present invention is improved in comparison with the conventional flash cell formed in the same cell size and dielectric layer as that used for the present invention. Also, the voltage applied to the control gate can be reduced, decreasing the power consumption. Furthermore, if a cell is to be formed to have a coupling effect identical to that found in the conventional flash cell, then the cell can be made smaller by using the present invention. This improves the integration of the memory device, and increases its production yield but decreases its production cost.

Therefore, it should be understood that the present invention is not limited to the particular embodiment disclosed herein as the best mode contemplated for carrying out the present invention, and that the present invention is not limited to the specific embodiments described in this specification except as defined in the appended claims.

What is claimed is:

1. A method for fabricating a nonvolatile memory device, comprising the steps of:

forming a field insulating layer on a field region of a substrate;

forming a disposable layer on said field insulating layer;

forming a first gate insulating layer on said active region;

forming a floating gate on said first gate insulating layer and on portions of said disposable layer;

removing said disposable layer;

forming a second gate insulating layer on the surface of said floating gate;

forming a control gate on said second gate insulating layer; and forming an impurity region in a portion of said substrate, said portion of said substrate being on at least one side of said control gate.

2. The method for fabricating a nonvolatile memory device as claimed in claim 1, wherein said method further comprises:

forming a sidewall against a side of said field insulating layer and said disposable layer.

3. The method for fabricating a nonvolatile memory device as claimed in claim 1, wherein said field insulating layer, and said first and second gate insulating layers are formed of a silicon oxide layer, and said disposable layer is formed of a silicon nitride layer.

4. The method for fabricating a nonvolatile memory device as claimed in claim 1, wherein said floating gate and said control gate are formed of polysilicon.

5. The method for fabricating a nonvolatile memory device as claimed in claim 1, wherein said step of removing said disposable layer includes isotropic etching.

6. The method for fabricating a nonvolatile memory device as claimed in claim 5, wherein said isotropic etching is wet etching.

7. The method for fabricating a nonvolatile memory device as claimed in claim 1, wherein said step of forming said impurity region includes ion-implanting impurities into said substrate.

8. The method for fabricating a nonvolatile memory device as claimed in claim 1, wherein said floating gate is separated from said field insulating layer.

9. The method for fabricating a nonvolatile memory device as claimed in claim 1, wherein said impurity region is formed on both sides of said control gate.

10. A method for fabricating a nonvolatile memory device, comprising the steps of:

forming a field insulating layer on a field region of a substrate;

forming a first gate insulating layer on an active region of said substrate;

forming a disposable layer on said field insulating layer;

forming a floating gate on said first gate insulating layer and on portions of said disposable layer;

removing said disposable layer such that said floating gate extends beyond said active region and partially over said field regions;

forming a second gate insulating layer on said floating gate; and forming a control gate on said second gate insulating layer and said field insulating layer such that portions of said control gate are between said floating gate and said field insulating layer.

11. A method for fabricating a nonvolatile memory device, comprising the steps of;

forming a field insulating layer on a field region of a substrate;

forming a first gate insulating layer on an active region of said substrate;

forming a floating gate on said first gate insulating layer said over portions of said field insulating layer;

forming a second gate insulating layer on said floating gate; and forming a control gate on said second gate insulating layer and said field insulating layer such that portions of said control gate are between said floating gate and said field insulating layer.

12. The method for fabricating a nonvolatile memory device as claimed in claim 10, wherein said step of removing said disposable layer includes isotropic etching.

13. The method for fabricating a nonvolatile memory device as claimed in claim 12, wherein said isotropic etching is wet etching.

14. The method for fabricating a nonvolatile memory device as claimed in claim 10, wherein said method further comprises the step of forming a sidewall against a side of said field insulating layer and said disposable layer.

15. The method for fabricating a nonvolatile memory device as claimed in claim 10, wherein said field insulating layer, and said first and second gate insulating layers are formed of a silicon oxide layer, and said disposable layer is formed of a silicon nitride layer.

16. The method for fabricating a nonvolatile memory device as claimed in claim 10, wherein said floating gate and said control gate are formed of polysilicon.

17. The method for fabricating a nonvolatile memory device as claimed in claim 10, further comprising:

forming an impurity region in a substrate being located on at least one side of said control gate.

18. The method for fabricating a nonvolatile memory device as claimed in claim 17, wherein said step of forming said impurity region includes ion-implanting impurities into said substrate.

19. The method for fabricating a nonvolatile memory device as claimed in claim 17, wherein said impurity region is formed on both sides of said control gate.

20. The method as in claim 11, further comprising:

forming sidewalls against exposed sides of said field insulating layer and said disposable layer;

wherein, after said disposable layer is removed, said sidewalls extend above a height of said field insulating layer.

* * * * *